(12) United States Patent
Murakami et al.

(10) Patent No.: US 7,447,026 B2
(45) Date of Patent: Nov. 4, 2008

(54) SYSTEM FOR HOT SWAPPING HEAT EXCHANGERS

(75) Inventors: Vance Murakami, Cupertino, CA (US); Robert Hintz, Cupertino, CA (US); Henry C. Coles, Cupertino, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 71 days.

(21) Appl. No.: 11/468,880

(22) Filed: Aug. 31, 2006

(65) Prior Publication Data

US 2008/0055845 A1 Mar. 6, 2008

(51) Int. Cl.
H05K 7/20 (2006.01)
F28D 15/00 (2006.01)

(52) U.S. Cl. ........................ 361/696; 361/699; 361/701; 165/80.3; 165/80.4; 165/104.33

(58) Field of Classification Search ......... 361/687–690, 361/694–696, 699–703; 165/80.3–80.5, 165/104.33; 312/223.1, 236
See application file for complete search history.

(56) References Cited

U.S. PATENT DOCUMENTS

| | | | |
|---|---|---|---|
| 4,650,414 A | 3/1987 | Grenfell | |
| 4,831,720 A | 5/1989 | Sherer et al. | |
| 4,917,525 A * | 4/1990 | Duncan | 403/27 |
| 6,065,531 A | 5/2000 | Schneider et al. | |
| 6,134,109 A | 10/2000 | Muller et al. | |
| 6,182,742 B1 * | 2/2001 | Takahashi et al. | 165/104.33 |
| 6,807,056 B2 * | 10/2004 | Kondo et al. | 361/689 |
| 6,882,531 B2 | 4/2005 | Modica | |
| 6,966,358 B2 * | 11/2005 | Rapaich | 165/80.4 |
| 6,980,435 B2 | 12/2005 | Shum et al. | |
| 7,050,299 B2 * | 5/2006 | Kondo et al. | 361/689 |
| 7,088,585 B2 * | 8/2006 | Chu et al. | 361/699 |
| 7,312,987 B1 * | 12/2007 | Konshak | 361/687 |
| 2006/0007655 A1 | 1/2006 | Symons | |
| 2006/0037331 A1 | 2/2006 | Nicolai et al. | |
| 2006/0067047 A1 * | 3/2006 | Pfahnl | 361/687 |
| 2006/0082970 A1 * | 4/2006 | Walz et al. | 361/699 |
| 2006/0102322 A1 | 5/2006 | Madara et al. | |
| 2006/0161311 A1 * | 7/2006 | Vinson et al. | 700/300 |
| 2007/0002536 A1 * | 1/2007 | Hall et al. | 361/695 |
| 2007/0081888 A1 * | 4/2007 | Harrison | 415/47 |
| 2007/0291452 A1 * | 12/2007 | Gilliland et al. | 361/699 |

OTHER PUBLICATIONS

Hannermann, Robert et al., "Pumped Liquid Multiphase Cooling", ASME, 2004, IMEC 2004, Paper IMECE2004-60669, Anaheim, California.*
Staubli, Connectors, The Connection Solution, Other Fluids (1 p.) [Online] http://www.staubli.com/web/coupling/division.nsf/TECCRD_PROSOL_KEY?OpenView . . . , May 19, 2006.

\* cited by examiner

*Primary Examiner*—Jayprakash N Gandhi
*Assistant Examiner*—Robert J Hoffberg

(57) ABSTRACT

An enclosure for housing electronic equipment comprises a cabinet for receiving the electronic equipment and a cooling system, wherein the cooling system comprises a coolant circulation system including a fluid inlet, a fluid outlet, and at least one fluid coupling device in fluid communication therewith, at least two heat exchange units, each heat exchange unit comprising a liquid-cooled heat exchanger in fluid communication with the coolant circulation system via the at least one fluid coupling device and each heat exchange unit including at least one blind mating sleeve, and at least one fan positioned to blow air across the heat exchanger, the cabinet including at least one guide pin for facilitating blind connection of the heat exchange unit to the fluid coupling device, the guide pin being positioned so as to be received in a blind mating sleeve when the heat exchange units are mounted in the cabinet.

19 Claims, 7 Drawing Sheets

SYSTEM FOR HOT SWAPPING HEAT EXCHANGERS

BACKGROUND

The present disclosure relates to systems for cooling electronic and other heat-generating equipment, and more particularly to systems for cooling electronic equipment operating in a rack or cabinet.

In recent decades, advances in the computer technology have greatly increased capabilities of computer hardware. This has been accompanied by a corresponding increase in the power consumed by computers and similar electronic devices, which in turn has resulted in a need for increased cooling capability, as the consumed power is ultimately converted into heat that must be removed from the system.

Many computer systems combine multiple computer/processor boards, which operate as "servers." These systems are typically housed in a rack or cabinet, in which several components can be mounted in a vertical stack. Existing cooling systems for electronic equipment contained in such a vertical rack often rely on air flow through the cabinet and therefore may not adequately remove heat from the system. As newer processor designs increase heat production ever further, it becomes increasingly necessary to provide cooling systems with the capacity to remove sufficient heat without adding undue space or operational requirements.

In addition, as the capacity of computer systems increases, the systems are used for more processes and play an increasingly significant role in the operation of many businesses. Thus, it becomes increasingly important to minimize computer system downtime.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection. Likewise, the term "in fluid communication with" is used to refer to fluid-containing devices between which a direct or indirect fluid passageway is provided.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
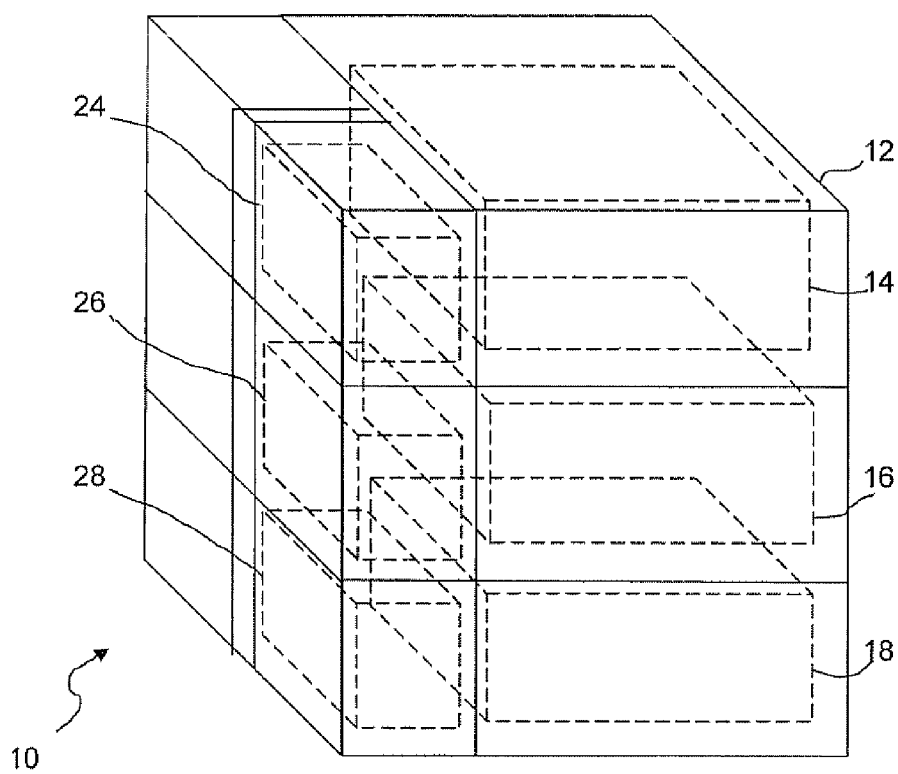
FIG. 1 shows schematically how a cooling system in accordance with certain embodiments of the invention could be arranged for use in conjunction with a computer system.
Figure 2:
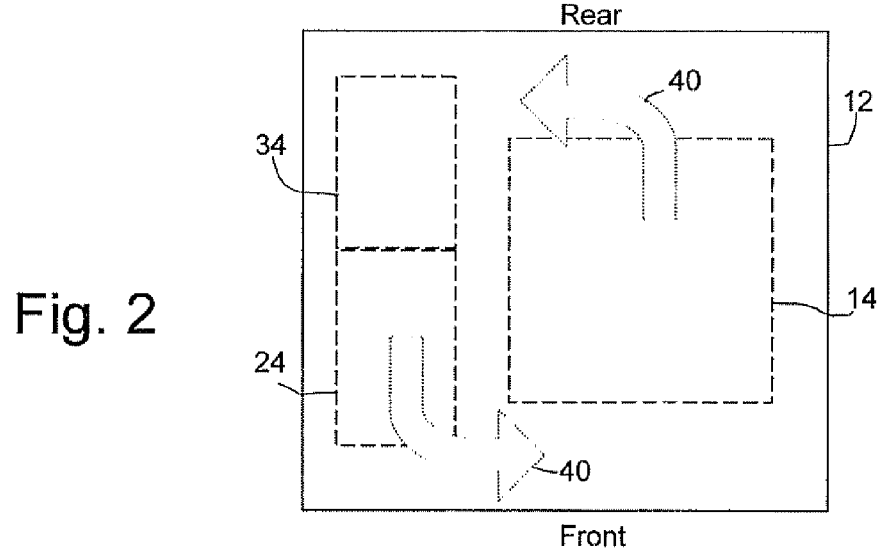
FIG. 2 is a schematic top view of the cooling system arrangement of FIG. 1.
Figure 5:
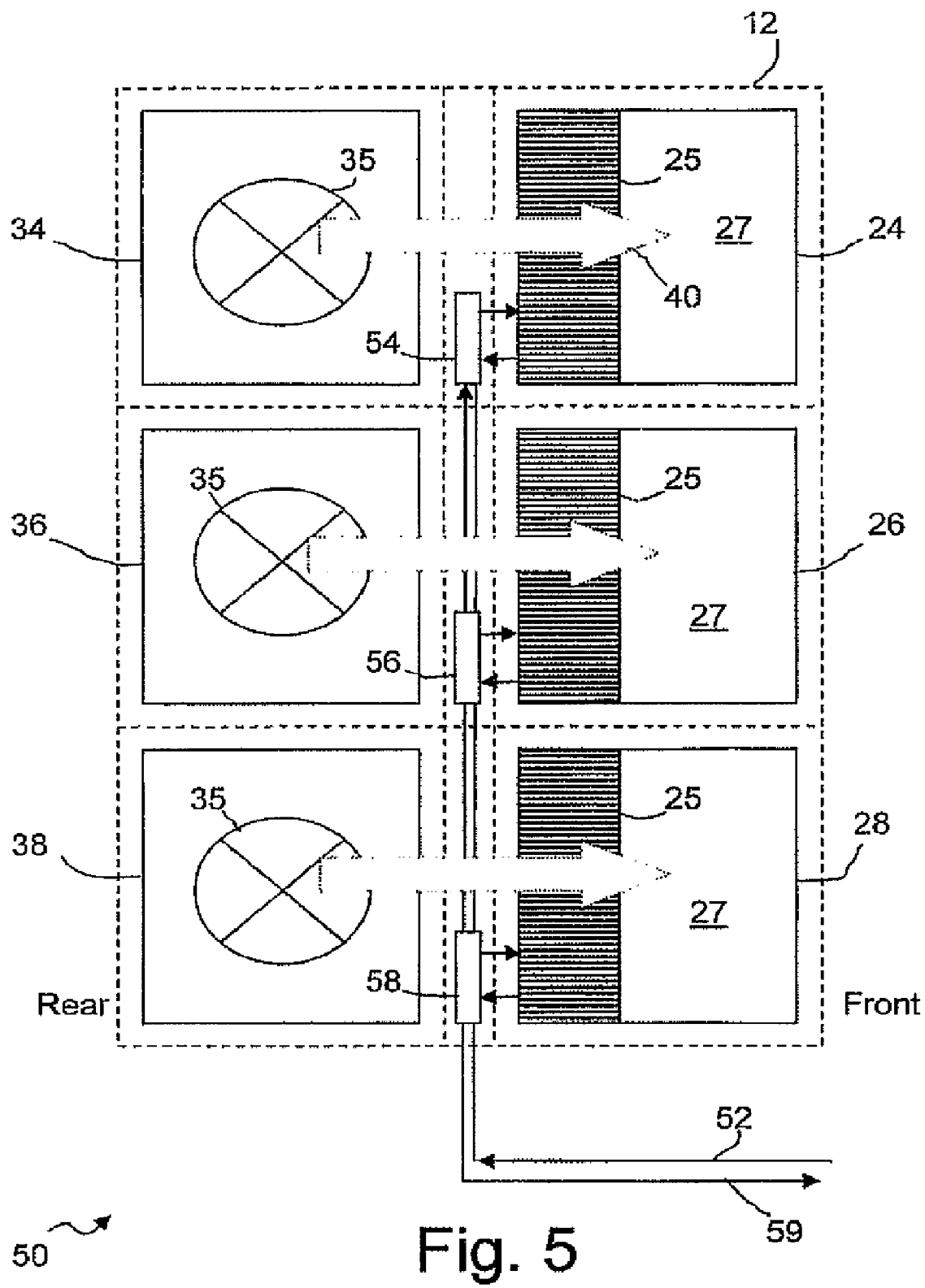
FIG. 5 is a schematic side view of one embodiment of a cooling system in accordance with an embodiment of the present invention.

As mentioned above, the present disclosure relates to systems for cooling electronic and other heat-generating equipment, and more particularly to systems for cooling the air flowing within a cabinet or enclosure housing electronic equipment. Referring initially to FIGS. 1, 2 and 5, a system 10 including a cooling system in accordance with the present invention may include a rack or cabinet 12, in which are housed a plurality of processors or other heat generating electronic equipment 14, 16, 18, a plurality of heat exchanger units 24, 26, 28, and a plurality of fans 34, 36, 38.

It will be understood that the arrangement, number, and configuration of equipment 14, 16, 18, heat exchangers 24, 26, 28, and fans 34, 36, 38 are not critical to the present invention and is illustrated herein merely to facilitate understanding of the invention. In the embodiment shown in FIGS. 1 and 2, warm air is pulled toward the back of the cabinet and pushed forward across the heat exchangers, and cooled air flows from the heat exchangers toward and across the heat generating equipment as indicated by arrows 40.

Figure 3:
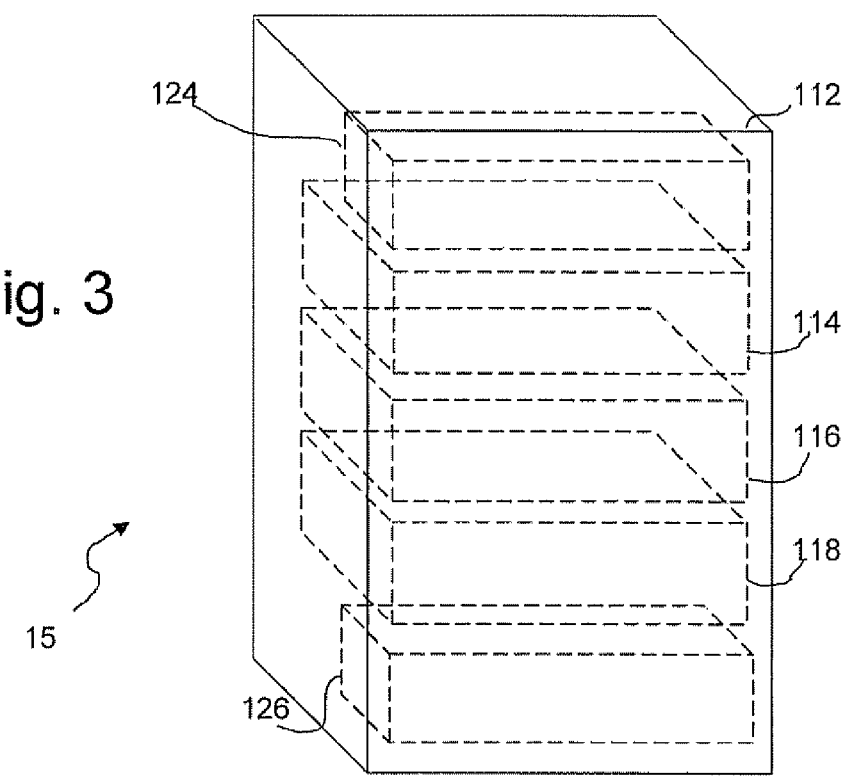
FIG. 3 is a schematic illustration of an alternative arrangement incorporating a cooling system for use in conjunction with a computer system.
Figure 4:
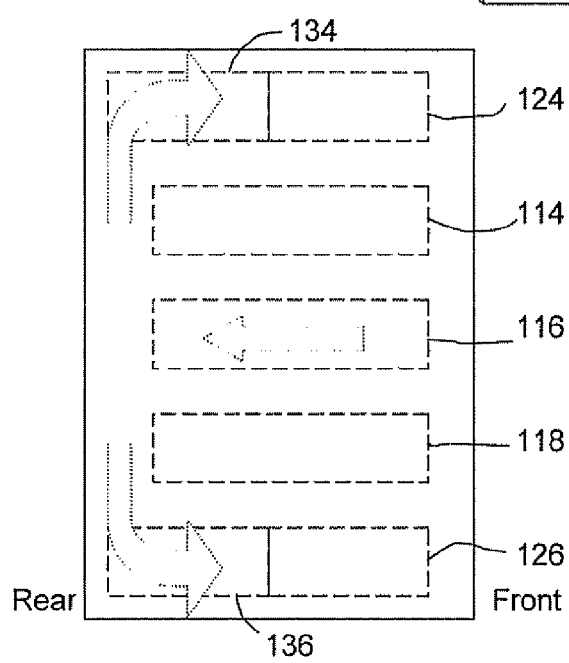
FIG. 4 is a schematic side view of the cooling system arrangement of FIG. 3.

Referring briefly to FIGS. 3 and 4, in an alternative embodiment 15, the equipment in the cabinet 112 arranged so that heat exchangers 124, 126 are above and below the heat generating equipment 114, 116, 118. In this embodiment, fans 134, 136 pull air rearward across equipment 114, 116, 118 and push it forward across heat exchangers 124, 126.

It will be understood that the arrangements shown in FIGS. 1 and 2 and FIGS. 3 and 4 are merely exemplary and that the heat generating equipment, fan(s), and heat exchanger(s) can be arranged in any desired configuration within cabinet 12. In preferred embodiments, the fans may be located either upstream or downstream from the heat exchanger(s). The fans are sized to provide a suitable static pressure at the front and rear of the rack mounted components and provide the necessary air moving power needed to overcome the restrictions of all components of the system including the rack.

Referring now to FIG. 5, heat exchanger units 24, 26, 28 are shown in stacked arrangement in cabinet 12. To support and secure equipment therein, cabinet 12 is preferably provided with doors, shelves, tracks, mounts, supports, and the like, all not shown, such as are common in the art. In the embodiment shown, each heat exchanger unit 24, 26, 28 is associated with a fan unit 34, 36, 38, respectively.

According to certain embodiments, each heat exchanger unit includes a heat exchanger 25 and an air duct 27. Heat exchangers 25 can be constructed of aluminum or other thermally conductive material and can have any suitable configuration. In some embodiments, heat exchangers 25 have a water- or liquid-cooled body having a liquid flow passage therethrough and a plurality of fins extending therefrom. The side walls (not shown) of each air duct 27 are preferably constructed so as to allow the passage of air therethrough, such as by the inclusion of mesh or perforations therein. In some embodiments, the top and/or bottom walls of each duct can also allow air flow therethrough. In still other embodiments, ducting is reduced or absent, so that air flows freely within the cabinet, subject to the motive force provided by the fan. In still other embodiments, ducting is included and further includes one or more devices to control the flow of air, such as flaps or other such items are as known in the art.

In some embodiments, it is possible to configure and operate the system such that a heat exchanger or fan can be removed from the system while the remaining hex/fan devices to cool the equipment within the cabinet. This avoids the need to shut down the unit during swap-out. For example, because the cooling system provides redundant heat exchangers, it is possible to detect a failure in one of the heat exchangers and remove the failed heat exchanger without shutting down either the cooling system or the electronic equipment for which it provides cooling. The electronic equipment can continue to operate while being cooled by the remaining heat exchanger(s). Further, a replacement heat exchanger can be placed into the cooling system and the cooling system can be restored to full cooling capacity, i.e., operation of both the replacement and the remaining heat exchanger(s), without shutting down either the cooling system or the electronic equipment in the cabinet. In these embodiments, the components of the cooling system are preferably sized to allow one unit to be down while still supplying sufficient cooling to keep the system functioning.

Still referring to FIG. 5, each fan unit 34, 36, 38 includes at least a fan 35 or other air mover. Fans 35 can be any suitable air mover, including but not limited to long-life, low vibration, centrifugal, axial, cross flow, and/or backward curved fans, such as are known for use in cooling computer equipment. As the air comes in contact with heat exchangers 25, it is cooled, so that as it flows back toward and across electrical equipment 14, it is capable of removing heat. Each fan can be positioned so that its axis is at a desired angle within the unit. Desired angles include but are not limited to angles that are parallel or transverse to the front-to-rear axis of the cabinet.

In order to remove heat from heat exchangers 25, a liquid coolant system 50 is provided. The liquid used in coolant system 50 may be water, brine, chilled water, antifreeze, refrigerant, dielectric, or any other suitable liquid, including preferably those having a high heat capacity. Coolant system 50 preferably includes an inlet line 52 and an outlet line 59. Between the inlet and the outlet, fluid circulates through cabinet 12 in a cooling circuit that includes a fluid coupling device 54, 56, 58 through which heat exchanger unit 24, 26, 28, respectively, is coupled to the coolant system 50. In preferred embodiments, heat exchangers 25 are hot-swappable, allowing them to be removed and replaced without requiring that either the cooling system or the adjacent computer system be shut down. In order to provide rapid and effective fluid coupling of both inflow and outflow lines to each heat exchanger, coupling of fluid flow lines is preferably accomplished using blindmating, dripless, bayonet-style quick-disconnect connectors, such as are available from Stäubli Corporation, U.S. of Duncan, S.C., or other suitable connector. In certain embodiments, guide pins are provided to align the fluid lines so as to facilitate blind connection thereof, as described in detail below.

Figure 6:
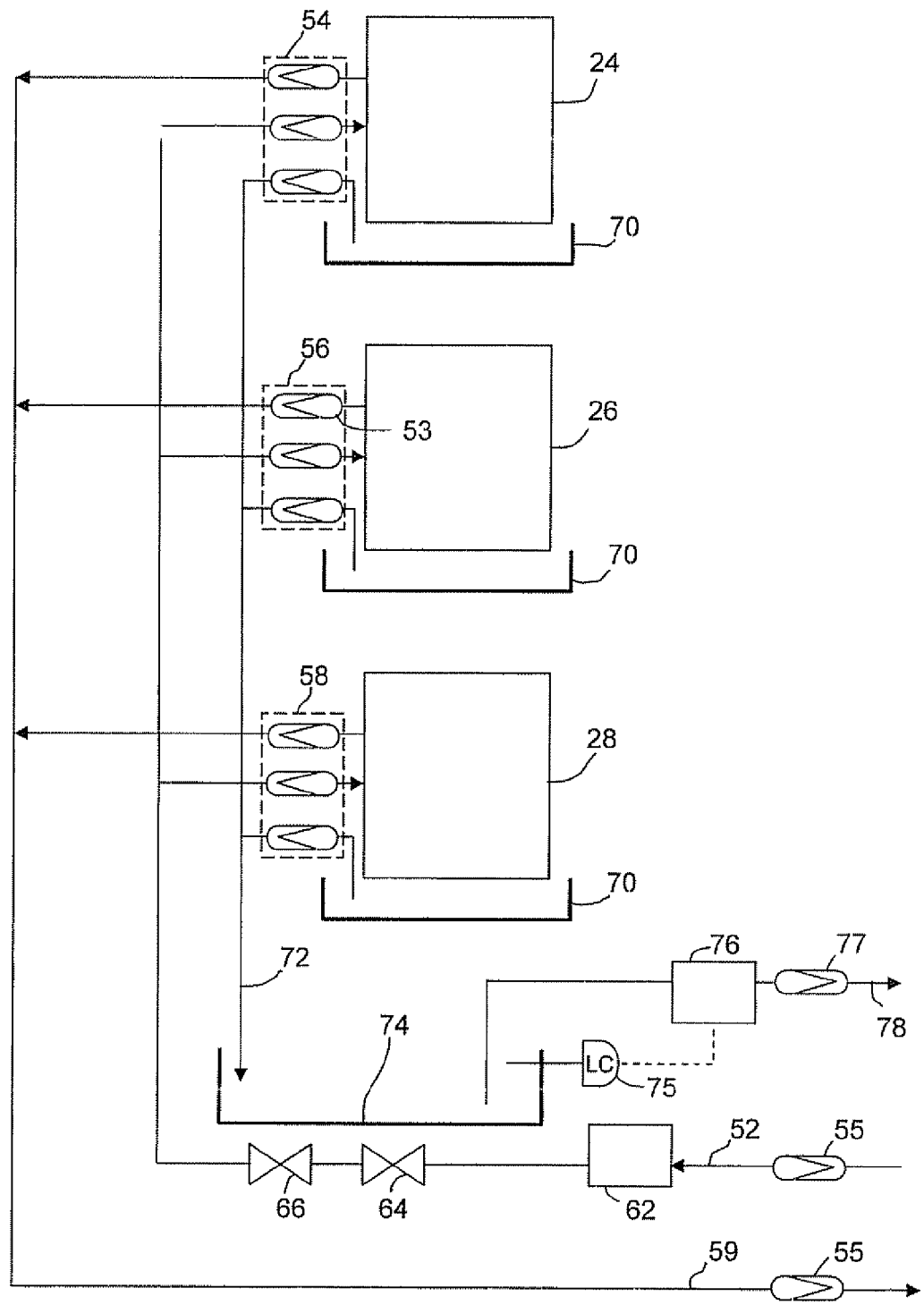
FIG. 6 is a schematic diagram of a water flow system for use in a cooling system in accordance with certain embodiments of the invention.

Referring now to FIG. 6, one embodiment of a coolant system 50 constructed in accordance with the present invention includes an inlet line 52 and an outlet line 59, as mentioned above. Inlet line 52 and outlet line 59 are each preferably provided with a dripless, bayonet-style quick-disconnect connector 55. Liquid coolant entering via inlet line 52 flows through an optional feed pump 62, a check valve 64, and a control valve 66 before flowing to the heat exchangers. Warmed coolant leaving the heat exchangers leaves the cabinet via outlet line 59. The heat exchanger units are preferably arranged in parallel on the coolant circuit, so that fluid flowing through each heat exchanger is approximately the same temperature. In alternative embodiments, the heat exchangers can be arranged in series. As mentioned above, a quick disconnect 53 is preferably provided at the inlet and outlet of each heat exchanger.

Still referring to FIG. 6, in preferred embodiments, the cooling system includes a condensate collection system. Depending on ambient humidity levels, warm air blowing across the cool surfaces of heat exchangers 25 may form condensate. To collect and remove the resulting condensate, the condensate collection system includes a condensate pan 70 positioned below each heat exchanger, a condensate line 72 into which each condensate pan drains via a pan drain, a condensate collector 74 into which condensate line 72 empties, a optional condensate pump 76, and a condensate outflow line 78. The condensate collection paths may function using gravity or a combination of gravity and pumps. In some embodiments, a level sensor 75 is provided in condensate collector 74 and controls condensate pump 76. A quick disconnect 77 may be included on condensate outflow line 78, so as to allow easy replacement of the condensate collector and related components.

In some embodiments, a condensate pan 70 is included in each heat exchanger unit and is part of the hot-swappable unit that includes the heat exchanger. In these embodiments, a quick disconnect 53 is also included on each condensate pan drain.

For ease of access and operation, the disconnects for each heat exchanger unit can be grouped within each fluid coupling device 54, 56, 58. The use of blindmating quick disconnects in each of the fluid flow lines allows the heat exchanger units to be rapidly removed and replaced. Heat exchanger units 24, 26, 28 are preferably sized and constructed so that a single unit can be safely removed and replaced by a single individual. The grouped fluid disconnects may also contain other electrical (e.g., AC power) and electronic signals as may be needed to support the exchange process or other status conditions. Thus, the present invention allows cooling system components to be removed and replaced without requiring a shut-down of the electronic devices that depend on them for cooling. As such, heat exchanger units 24, 26, 28 may also be referred to as "customer replaceable units (CRUs)" or "field replaceable units (FRUs)."

Figure 7:
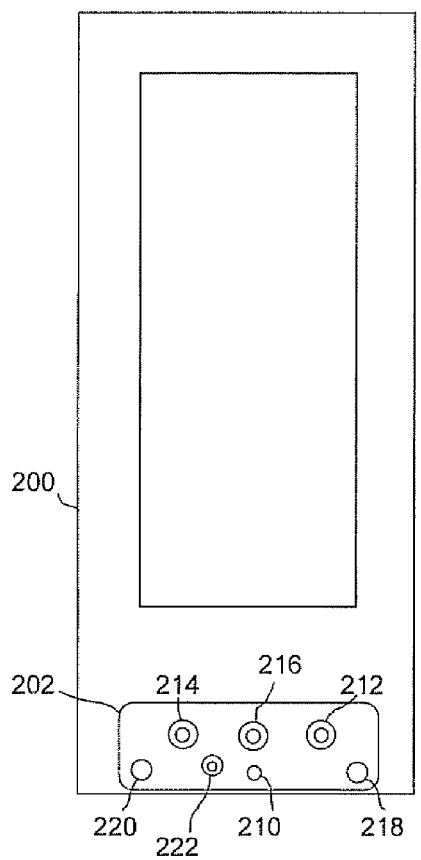
FIGS. 7-9 are rear, side and front views, respectively of a heat exchanger unit constructed in accordance with a particular embodiment of the invention.
Figure 8:
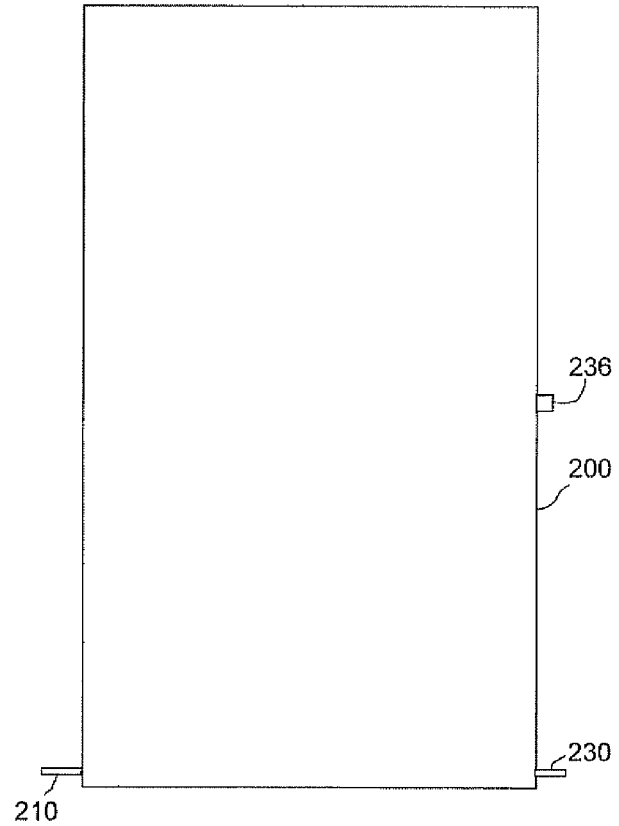
Figure 9:
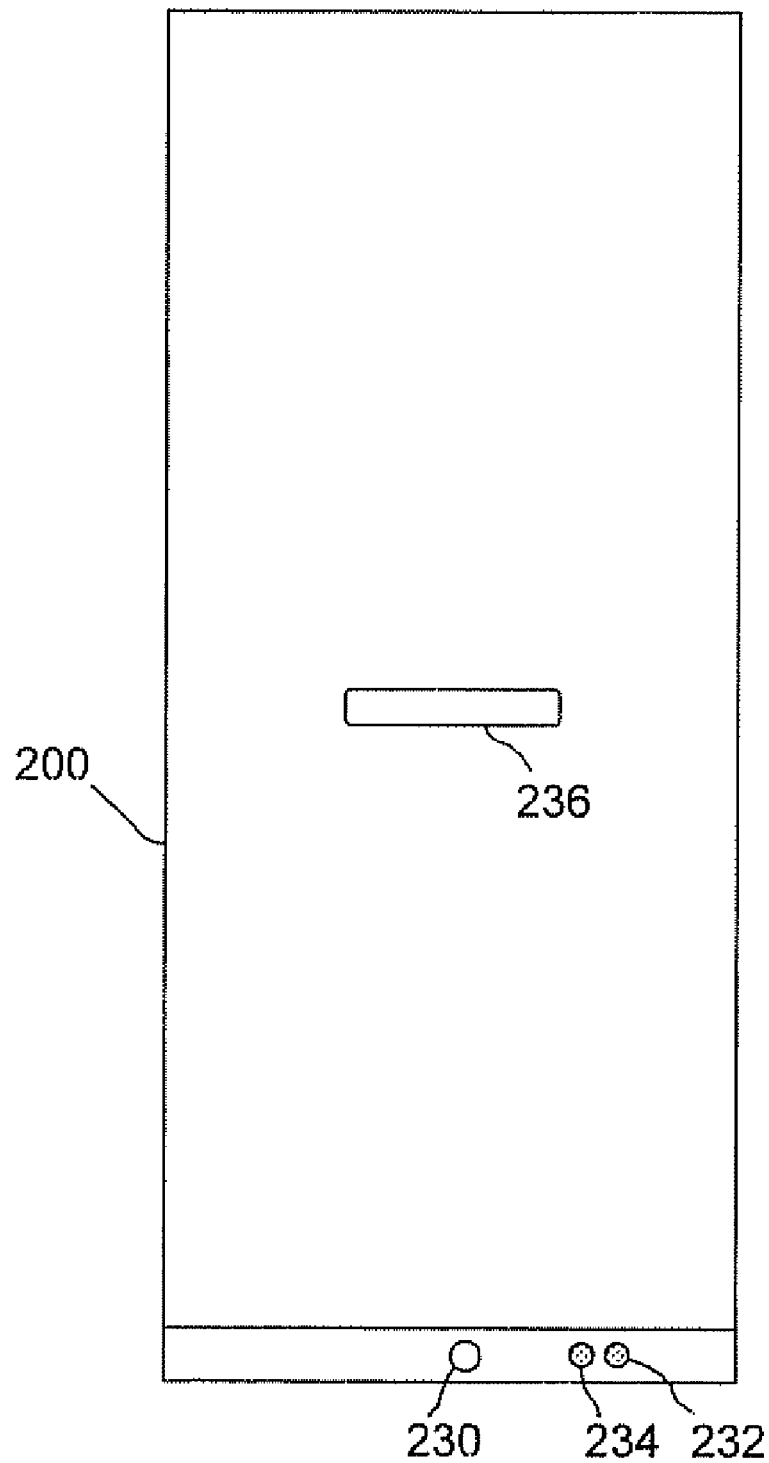

By way of example only, one configuration for an exemplary heat exchanger unit is illustrated in FIGS. 7-9. Referring first to FIG. 7, the rear of the heat exchanger unit 200 includes a connection panel 202 through which the various connections are made. Specifically, in this example, connection panel 202 includes a threaded bolt 210, a water inlet 212, a water outlet 214, an electrical connector 216, first and second mating blind sleeves 218, 220, and a condensate outlet 222. Bolt 210 is used to releasably secure heat exchanger unit 200 into a frame or cabinet once heat exchanger unit 200 is emplaced.

First and second mating blind sleeves 218, 220, align with and receive mating guide pins (not shown) that are provided within the cabinet. The guide pins are positioned so as to guide the heat exchanger unit into the proper position during installation or replacement. Water inlet 212, water outlet 214 receive the quick-disconnect fluid connectors of the fluid coupling device to which heat exchanger unit 200 is connected. Similarly, condensate outlet 222 connects to the condensate collection system via a quick-disconnect connector.

In certain embodiments, at least one indicator light is provided on the front of the module to indicate when a connection is complete. Referring now to FIG. 9, the front of the exemplary heat exchanger unit 200 includes a crank head 230, indicator lights 232, 234, and a handle 236. Indicator lights 232, 234 are preferably different colors and indicate completion of different stages of connection. For example, indicator 232 may be yellow and may be used to indicate that the heat exchanger unit 200 is partially engaged or connected and indicator 232 may be green and may be used to indicate that the heat exchanger unit 200 is fully engaged and connected. At the rear of the heat exchanger unit, sensor 216 (FIG. 7) can be used to detect and confirm connection of the heat exchange unit to the associated fluid coupling device.

Crank head 230 at the front of heat exchanger unit 200 is used in combination with a corresponding tool (not included) to advance the heat exchanger unit onto the connections at the rear of the heat exchanger unit. Once the heat exchanger unit 200 is disconnected, handle 236 may be used to facilitate removal of the unit from the cabinet.

Figure 10:
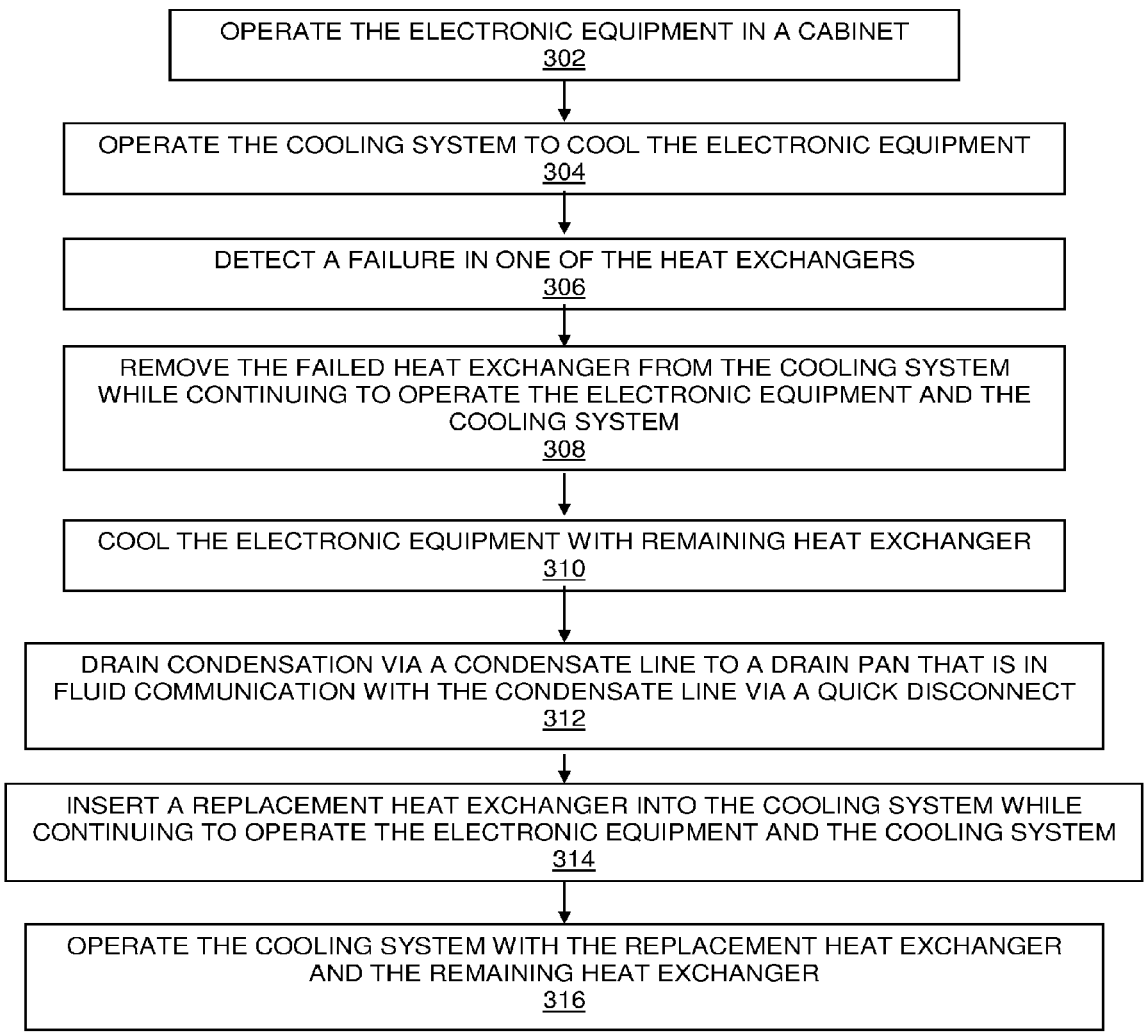
FIG. 10 illustrates a method embodiment.

FIG. 10 illustrates a method 300 as described above. Method 300 comprises actions 302-316. At 302, the method comprises operating the electronic equipment in a cabinet. At 304, the method comprises operating the cooling system to cool the electronic equipment. At 306, the method further comprises detecting a failure in one of the heat exchangers. At 308, the method comprises removing the failed heat exchanger from the cooling system while continuing to operate the electronic equipment and the cooling system. At 310, the method comprises cooling the electronic equipment with a remaining heat exchanger. At 312, the method comprises draining condensation via a condensate line to a drain pan that is in fluid communication with the condensate line via a quick disconnect. At 314, the method comprises inserting a replacement heat exchanger into the cooling system while continuing to operate the electronic equipment and the cooling system. At 316, the method comprises operating the cooling system with the replacement heat exchanger and the remaining heat exchanger.

The above discussion is meant to be illustrative of the principles and various embodiments of the present invention. Numerous variations and modifications will become apparent to those skilled in the art once the above disclosure is fully appreciated. For example, the number, size, and configuration of the heat exchangers and fans can be varied, various styles of disconnects can be used, and the components of the system can be arranged in series, in parallel, or in some combination thereof. In addition, various controls, such as thermo-static controls, volume controls, safety controls are within the ordinary skill in the art and can be included without departing from the principles of the invention. It is intended that the following claims be interpreted to embrace all such variations and modifications.

What is claimed is:

1. An enclosure for housing electronic equipment, comprising:
    a cabinet for receiving the electronic equipment and a cooling system,
        wherein said cooling system comprises:
        a coolant circulation system including a fluid inlet, a fluid outlet, and at least one fluid coupling device in fluid communication therewith;
        at least two heat exchange units, each heat exchange unit comprising a liquid-cooled heat exchanger in fluid communication with said coolant circulation system via said at least one fluid coupling device and each heat exchange unit including at least one blind mating sleeve;
        at least one fan positioned so as to blow air across said heat exchanger; and
        a condensate line, wherein each heat exchange unit includes a condensate pan having a pan drain, and wherein each pan drain is in fluid communication with said condensate line via a bayonet-style connector; and
    wherein said cabinet includes at least one guide pin for facilitating blind connection of said heat exchange unit to said fluid coupling device, each guide pin being positioned so as to be received in a blind mating sleeve when said heat exchange units are mounted in said cabinet.

2. The enclosure of claim 1 wherein each heat exchange unit further includes at least one indicator light for indicating connection of said heat exchange unit to said fluid coupling device.

3. The enclosure of claim 1 wherein each heat exchanger includes an inlet line and an outlet line, and wherein said inlet line and said outlet line are each coupled to a fluid coupling device by a bayonet-style connector.

4. The enclosure of claim 1 wherein each heat exchange unit is hot-swappable.

5. The enclosure of claim 1, further including a connection sensor electrically connected to an indicator light.

6. The enclosure of claim 1 wherein a first indicator light indicates that the heat exchanger unit is partially connected and a second indicator light indicates that the heat exchanger unit is fully connected.

7. The enclosure of claim 1 wherein each heat exchange unit is associated with a corresponding fan.

8. The enclosure of claim 1 wherein each fan is included in a fan unit and wherein each fan unit is hot-swappable.

9. The enclosure of claim 1, wherein said cooling system further includes a condensate collector into which said condensate line drains and a pump in fluid communication with said condensate collector.

10. A computer system, comprising:
    at least one processor;
    a cabinet for receiving and supporting the processor; and
    a cooling system housed in said cabinet, wherein said cooling system comprises:
        a coolant circulation system including a fluid inlet, a fluid outlet, and at least one fluid coupling device in fluid communication therewith;
        at least two heat exchange units, each heat exchange unit comprising a liquid-cooled heat exchanger in fluid communication with said coolant circulation system via said at least one fluid coupling device and each heat exchange unit including at least one blind mating sleeve;
        at least one fan positioned so as to blow air across said heat exchanger;

a condensate line, wherein each heat exchange unit includes a condensate pan having a pan drain, and wherein each pan drain is in fluid communication with said condensate line via a bayonet-style connector; and wherein said cabinet includes at least one guide pin for facilitating blind connection of each heat exchange unit to said fluid coupling device, each guide pin being positioned so as to be received in a blind mating sleeve when said heat exchange units are mounted in said cabinet.

11. The computer system of claim 10 wherein each heat exchange unit further includes at least one indicator light for indicating connection of said heat exchange unit to said fluid coupling device.

12. The computer system of claim 10 wherein each heat exchange unit includes an inlet line and an outlet line, and wherein said inlet line and said outlet line are each coupled to a fluid coupling device by a bayonet-style connector.

13. The enclosure of claim 10 wherein each heat exchange unit is hot-swappable.

14. The enclosure of claim 10 wherein each heat exchange unit is associated with a corresponding fan.

15. The enclosure of claim 10 wherein each fan is included in a fan unit and wherein each fan unit is hot-swappable.

16. The enclosure of claim 15 wherein each fan unit includes a duct for directing air.

17. The enclosure of claim 11, wherein said cooling system further includes a condensate collector into which said condensate line drains and a pump in fluid communication with said condensate collector.

18. A method for operating electronic equipment in a cabinet having a cooling system with at least two heat exchange units, each heat exchange unit comprising a liquid-cooled heat exchanger in fluid communication with a coolant circulation system, comprising:
    operating the electronic equipment in the cabinet;
    operating the cooling system so as to cool the electronic equipment;
    detecting a failure in one of the heat exchangers;
        removing the failed heat exchanger from the cooling system while continuing to operate the electronic equipment and the cooling system;
    cooling the electronic equipment with a remaining heat exchanger; and
    draining condensation via a condensate line to a drain pan that is in is in fluid communication with said condensate line via a quick disconnect.

19. The method of claim 18, further including the steps of inserting a replacement heat exchanger into the cooling system while continuing to operate the electronic equipment and the cooling system and then operating the cooling system with said replacement heat exchanger and said remaining heat exchanger.

* * * * *

UNITED STATES PATENT AND TRADEMARK OFFICE
CERTIFICATE OF CORRECTION

PATENT NO. : 7,447,026 B2 Page 1 of 1
APPLICATION NO. : 11/468880
DATED : November 4, 2008
INVENTOR(S) : Vance Murakami et al.

It is certified that error appears in the above-identified patent and that said Letters Patent is hereby corrected as shown below:

In column 8, line 1, in Claim 17, delete "claim 11" and insert -- claim 10 --, therefor.

In column 8, line 20, in Claim 18, delete "is in" before "fluid".

Signed and Sealed this

Thirty-first Day of March, 2009

JOHN DOLL
*Acting Director of the United States Patent and Trademark Office*